(12) United States Patent
Bjoerk et al.

(10) Patent No.: US 7,947,580 B2
(45) Date of Patent: May 24, 2011

(54) HYBRID SEMICONDUCTOR STRUCTURE

(75) Inventors: Mikael T. Bjoerk, Adliswil (CH); Oliver Hayden, Herzogenaurach (DE); Heike E. Riel, Baech (CH); Walter Heinrich Riess, Thalwil (CH); Heinz Schmid, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 12/331,675

(22) Filed: Dec. 10, 2008

(65) Prior Publication Data

US 2009/0146133 A1    Jun. 11, 2009

(30) Foreign Application Priority Data

Dec. 11, 2007 (EP) ................... 07122904

(51) Int. Cl.
*H01L 21/20* (2006.01)
*H01L 21/36* (2006.01)
*H01L 21/00* (2006.01)

(52) U.S. Cl. ......... 438/503; 257/E21.101; 257/E21.521; 977/762

(58) Field of Classification Search .................. 438/503; 257/E21.101, E21.521; 977/762
See application file for complete search history.

(56) References Cited

U.S. PATENT DOCUMENTS 7,432,522 B2 * 10/2008 Samuelson et al. ............. 257/12
2007/0257246 A1 * 11/2007 Bakkers et al. .................. 257/2

OTHER PUBLICATIONS

Fulin Xiong, et al., "Liquid-metal-mediated homoepitaxial . . . ", Appl. Phys. Lett. 59, (27), Dec. 1991.
Yue Wu, et al., "Controlled Growth and Structures of Molecular-Scale . . . ", Nano Letters, 2004, vol. 4, No. 3, pp. 433-436.
Volker Schmidt, et al., "Diameter-Dependent Growth Direction . . . ", Nano Letters, 2005, vol. 5, No. 5, pp. 931-935.
Kok-Keong Lew, et al., "Template-directed vapor-liquid-solid growth of silicon nanowires", J. Vax. Sci. Technol. B 20 (1), Jan./Feb. 2002, pp. 389-392.
Hemanth Jagannatha.N, et al., "Templated germanium nanowire synthesis using oriented . . . " J. Vac. Sci. Technol. B 24(5), Sep./Oct. 2006, pp. 2220-2224.
Hong Jin Fan, et al., "Semiconductor Nanowires: From Self-Organization to Patterned Growth", www.small-journal.com, 2006, pp. 700-717.

* cited by examiner

*Primary Examiner* — Alexander G Ghyka
*Assistant Examiner* — Seahvosh J Nikmanesh
(74) *Attorney, Agent, or Firm* — Gail H. Zarick

(57) ABSTRACT

A method for the fabrication of a semiconductor structure that includes areas that have different crystalline orientation and semiconductor structure formed thereby. The disclosed method allows fabrication of a semiconductor structure that has areas of different semiconducting materials. The method employs templated crystal growth using a Vapor-Liquid-Solid (VLS) growth process. A silicon semiconductor substrate having a first crystal orientation direction is etched to have an array of holes into its surface. A separation layer is formed on the inner surface of the hole for appropriate applications. A growth catalyst is placed at the bottom of the hole and a VLS crystal growth process is initiated to form a nanowire. The resultant nanowire crystal has a second different crystal orientation which is templated by the geometry of the hole.

7 Claims, 4 Drawing Sheets

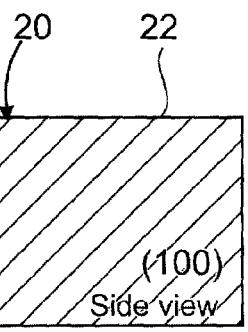
Fig. 1A
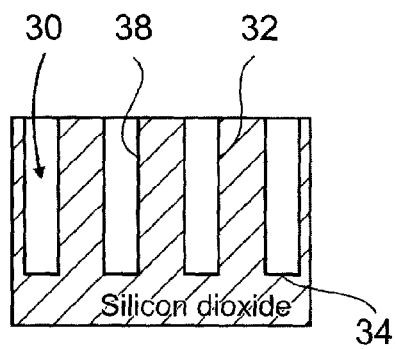
Fig. 1B
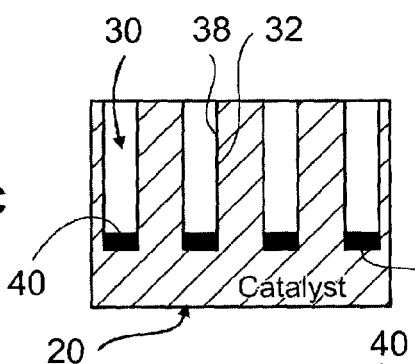
Fig. 1C
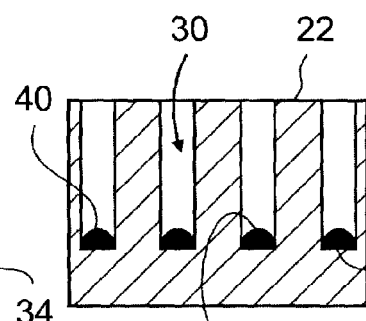
Fig. 1D
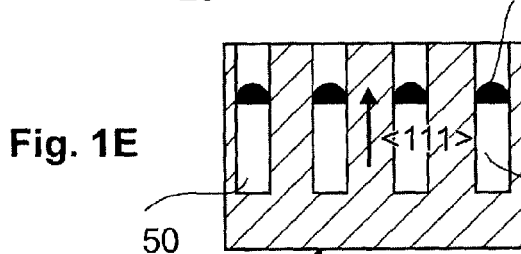
Fig. 1E
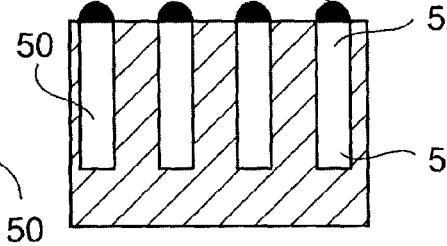
Fig. 1F
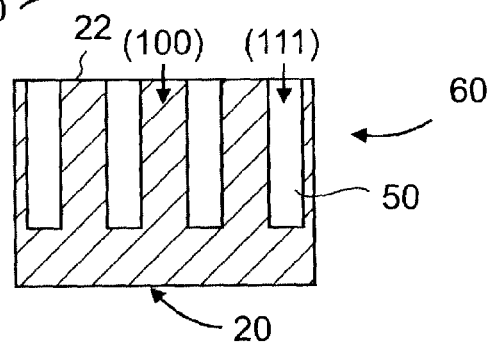
Fig. 1G
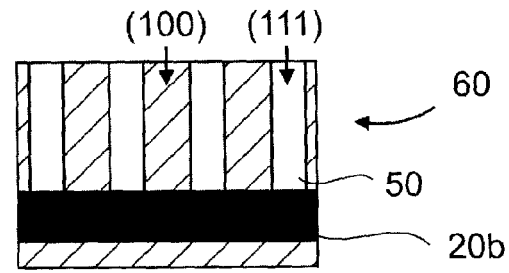
Fig. 1H
Fig. 1

HYBRID SEMICONDUCTOR STRUCTURE

CROSS-REFERENCE TO RELATED APPLICATIONS

This application claims priority under 35 U.S.C. §119 from European Patent Application No. 07122904.1 filed Dec. 11, 2007, the entire contents of which are incorporated herein by reference.

BACKGROUND OF THE INVENTION

1. Field of the Invention

The present invention is in the field of process technology for the manufacture of semiconductor solid-state devices or of parts thereof. More specifically, the present invention relates to the manufacture of a semiconductor structure and components using processes to integrate semiconducting components of different crystalline orientation within the same substrate.

2. Description of the Related Art

Semiconductor structures having components with different crystal orientations are of particular interest for the fabrication of high mobility metal-oxide semiconductor field effect transistors (MOSFETs) both in vertical or lateral architecture. The mobility of electrons and holes in silicon MOSFETs depends on the surface orientation of the crystals and are the highest for electrons in <100> and holes in <110> or <111> orientations. It is thus of technological interest to combine both silicon orientations on a single wafer.

This is currently achieved only by wafer bonding of silicon with different crystal orientation. (See U.S. Pat. Nos. 7,023,057, 7,023,055, and 7,041,538). An alternative process relies on a method to selectively grow epitaxial silicon in a trench formed within a silicon-on-insulator (SOI) structure. (See U.S. Pat. No. 6,555,891). The SOI structure includes a buried silicon oxide layer (BOX) on a bulk silicon substrate having, for example, a <100> orientation, covered with a silicon layer of another orientation, e.g. <110>.

Future MOSFETs will rely on higher device density and combinations of novel materials, such as III-V and II-VI semiconductors, and germanium (Ge) which have higher charge carrier mobility than silicon. However, because of physical and/or economical reasons, large Ge or III-V substrates are not currently available. Thus, a process to grow areas of high mobility semiconductors on readily available silicon wafers is of significant interest. So far, however, attempts to grow, for example, III-V materials on silicon are hampered by the lattice mismatch of the semiconducting crystals.

Vapor-Liquid-Solid (VLS) growth is known for selective growth of semiconducting nanowires using a catalytic nanoparticle, typically made from gold (Au). See "Semiconductor Nanowires: From Self-Organization to Patterned Growth", Hong Jin Fan et al., small 2006, 2, No. 6, pages 700-717. It was observed that the crystal orientation of epitaxial and non-epitaxial silicon nanowires (SiNWs) depends on the diameter of the SiNW. SiNWs having diameters larger than 30 nm grow exclusively in the <111> direction. See "Diameter-Dependent Growth Direction of Epitaxial Silicon Nanowires", V. Schmidt et al., nanoletters 2005, Vol. 5, No. 5, pages 931-935, and "Controlled Growth and Structures of Molecular-Scale Silicon Nanowires" Yue WU et al., Nanoletters, 2004, Vol. 4, No. 3, pages 433-436. Further, VLS-growth of epitaxial III-V and Ge nanowires (NWs) on Si has been reported. VLS growth of epitaxial and random oriented silicon nanowires within the pores of anodized aluminum oxide membranes has been demonstrated. See "Template-directed vapor-liquid-solid growth of silicon nanowires", Kok-Keong Lew et al., Journal of Vacuum Science and Technology B 20(1), January/February 2002, pages 389-392. Further, VLS growth of epitaxial and random oriented silicon nanowires within porous organosilicate thin films has also been demonstrated. See "Templated germanium nanowire synthesis using oriented mesoporous organosilicate thin films" H. Jagannathan et al., Journal of Vacuum Science and Technology B 24(5), September/October 2006, pages 2220-2224. In these cases the pores act as guides or templates for the VLS growth (templated growth). VLS based methods to grow epitaxial Ge layers on Si has been reported but only on a flat, non structured surface. See "Liquid-metal-mediated homoepitaxial film growth of Ge at low temperature", F. Xiong et al., Applied Physic Letters 59 (27), 30 Dec. 1991, pages 3586-3588. Finally, doping during VLS-growth of nanowires has also been demonstrated.

It would be of benefit in the field to have a more ideal semiconductor structure for high mobility device fabrication and a manufacturing process for such semiconductor structure.

SUMMARY OF THE INVENTION

According to an aspect of the present invention there is provided a method for fabricating a hybrid semiconductor structure including semiconducting components with semiconducting crystals of different crystallographic orientation. The method includes the steps of providing a semiconductor substrate having a first crystallographic orientation, causing a hole to be disposed in a surface of the semiconductor substrate, the hole having an interior wall and a bottom at a depth extending into the thickness of the substrate, coating the hole with a separation layer, depositing a growth catalyst at the bottom of the hole, and initiating a crystal growth process to grow a single-crystalline nanowire in the hole, whereby the single-crystalline nanowire has a crystallographic orientation different of the substrate.

As a result, a hybrid semiconducting structure is provided with the substrate as a first semiconducting component having a first crystallographic orientation, and at least one nanowire as a second semiconducting component having a second crystallographic orientation different to the crystallographic orientation of the substrate.

Such method has several advantageous features over prior methods of producing hybrid semiconductor substrates. These include: single-crystalline nanostructures can be produced; VLS or similar crystal growth processes can be used and the crystal orientation can be determined; the resultant crystal nanowire is decoupled from the starting substrate which implies that there is no need for epitaxial growth and lattice matching processes.

The method of the present invention can be applied for different materials combinations (e.g., Si, Ge, III/Vs, and II/VI) and doping levels.

BRIEF DESCRIPTION OF THE DRAWINGS

Reference will now be made, by way of example, to the accompanying drawings which illustrate embodiments of the present invention:

FIG. 1 shows the various stages of a semiconductor structure in a lateral cut, processed according to an embodiment of the invention wherein specifically, FIG. 1A shows a schematic cross-sectional view of a <100> silicon wafer, FIG. 1B shows a schematic illustration of the silicon wafer of FIG. 1A with holes/trenches (template) disposed in its surface and into the thickness of a <100> silicon wafer, and with a spacer layer grown or deposited on the walls of the holes in the substrate, FIG. 1C shows a schematic representation with a metal catalyst deposited in the bottom of the holes in the silicon wafer, FIGS. 1D and 1E show schematic representations of the beginning and continuation of VLS growth in the template, FIGS. 1F and 1G respectively show schematic representations illustrating stopping nanowire growth at the end of the holes/trenches, and removing the catalyst from the growth end of the nanowires, FIG. 1H is a schematic representations showing the implementation using a silicon on insulator (SOI) substrate.

DETAILED DESCRIPTION OF THE PREFERRED EMBODIMENTS

Figure 2:
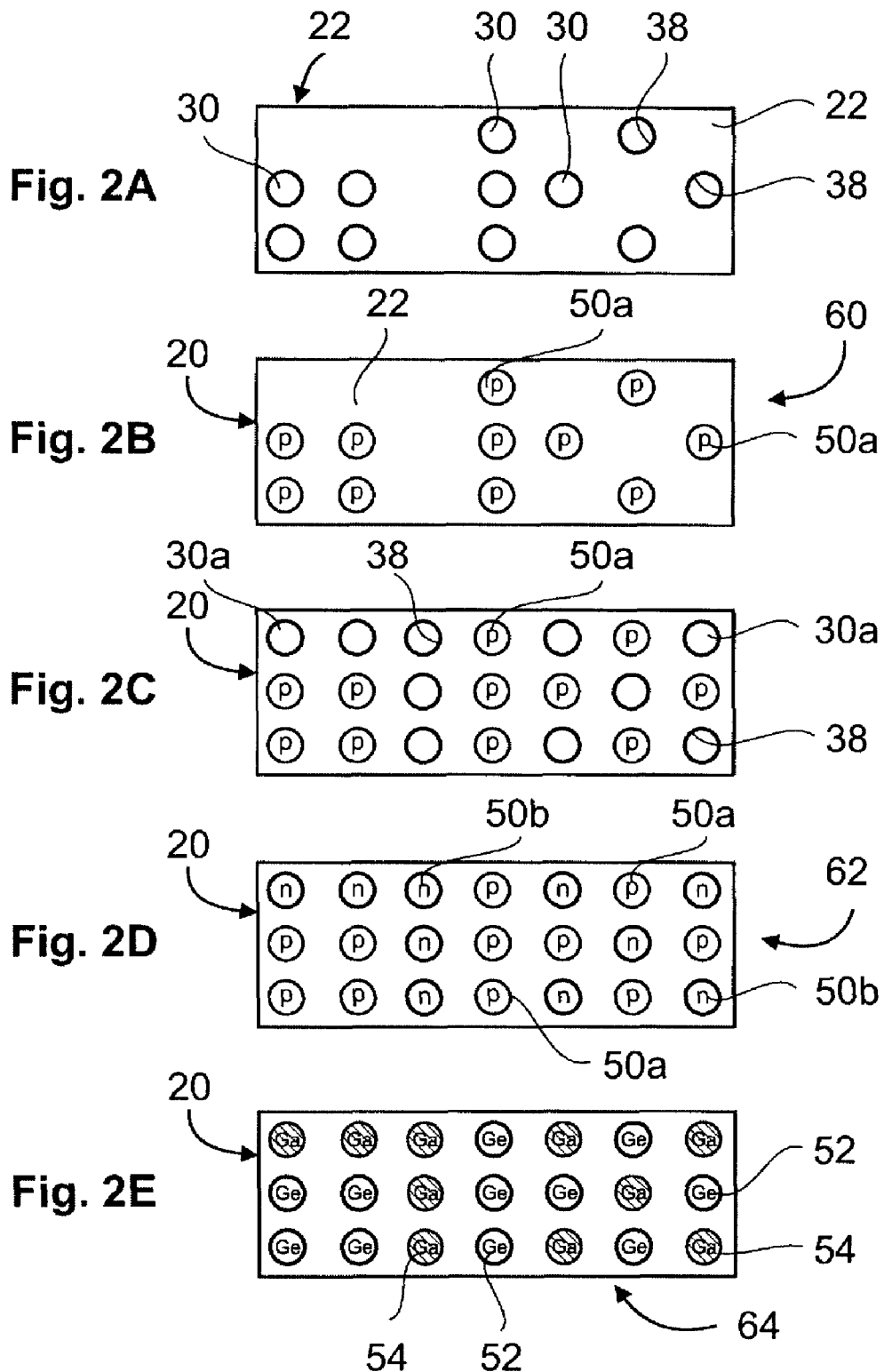
FIGS. 2A to 2D show schematic representations illustrating the fabrication of arrays of p- and n-type nanowires in a silicon substrate, in a top view, specifically showing: (A) lithographically-defined holes and with spacer layers; (B) growth of p-type Si nanowires; (C) removal of the gold catalyst and definition of a second array of holes; (D) growth of n-type Si nanowires.
FIG. 2E shows a schematic representation illustrating using the same process to grow Ge NWs and GaAs NWs in a silicon substrate.

Preferably, the present invention includes an inexpensive silicon wafer substrate on which highly dense patterns of different semiconductors, having different crystal orientations and/or doping type and/or concentrations can be fabricated. The combination of silicon substrates with semiconductors having different crystal orientations or with different semiconductors is preferably achieved using a vapor-liquid-solid (VLS) or similar process for the growth of one or more semiconducting nanowires within the substrate. The position, dimension and crystal orientation of the nanowires within the substrate is preferably controlled by a template in which the one or more nanowires grow.

The VLS growth is a catalytically driven process that yields single-crystalline nanowires. In such process, diluted silane is preferably used as precursor gas for the vapor deposition acting in combination with the growth catalyst typically being a metal heated into liquid state. The result is a solid nanowire grown in the hole of the substrate and being isolated against the substrate by means of the separation layer. Other crystal growth processes can be used where applicable such as a pure vapor-solid-solid (VSS) process where the growth catalyst does not need to be transformed in a liquid state.

The crystallographic orientation of the single-crystalline nanowire grown in the hole can preferably be defined by defining a template cross-section of the hole. The cross-section of the hole preferably is a circle with a diameter defined according to one of the following embodiments. As the following preferred diameters refer to the diameter of the nanowire, the diameter of the hole can be derived from the diameter of the nanowire plus twice the thickness of the separation layer. Preferably, the diameter of the hole is defined such that a diameter of the nanowire is equal to or greater than 30 nm. For those diameters, a crystal <111> orientation becomes dominant in the growth of the nanowire. In another embodiment, the diameter of the hole is defined such that a diameter of the nanowire to be grown in the hole is equal to or less than 20 nm. For those diameters, a crystal <110> orientation becomes dominant in the growth of the nanowire. In this respect, disclosure of "Diameter-Dependent Growth Direction of Epitaxial Silicon Nanowires", V. Schmidt et al., nanoletters 2005, Vol. 5, No. 5, pages 931-935 is herewith incorporated by reference.

However, other than circular cross-sections can be used, such as a square cross-section. Here, the edge-length of the square preferably represents the diameter of the hole, respectively the nanowire. Other cross-sections can be used where the diameter dimension needs to be determined in relation to the shape of the cross-section.

Other preferred embodiments of the method refer to further processing of the semiconductor structure for further use, and may include steps of removing the catalyst from a growth end of the nanowire and chemical-mechanical polishing the substrate. In an additional step, such surface may be overgrown with an additional layer.

Another preferred embodiment aims at fabrication of a semiconductor structure having components with at least three different crystal orientations, i.e. the substrate with its crystal orientation and two different types of nanowires grown in holes of the substrate each type, also referred to as sets, showing a crystal orientation different to the nanowires of the other set, and different to the orientation of the substrate. Preferably, the first set of nanowires is built first before the holes for the second set of nanowires are created in the substrate and the second set of nanowires is produced. The sequential processing is beneficial in particular when different dopants are added to the formation process of the different sets of nanowires. Alternatively, the creation of holes and the coating of the separation layer can initially be processed for both sets of holes whereas the formation of the nanowires can be separated such that the formation of the first set of nanowires is completed before the formation of the second set of nanowires is started. The deposition of the growth catalyst preferably belongs to the sequential step of forming the various nanowires.

Again, the definition of the cross-section of the holes is considered to be the preferred step which enables growth of nanowires of a preferred orientation. Consequently, with the above preferred embodiment, the cross-section of each hole belonging to the first set of holes preferably is different to the cross-section of each of the holes belonging to the second set of holes such that the first set of holes show a different cross-section than that of the second set of holes. Preferably, the nanowires corresponding to and grown in the first set of holes have a diameter equal to or smaller than 20 nm, and preferably, the nanowires corresponding to and grown in the second set of holes have a diameter equal to or greater than 30 nm.

By means of such embodiments, highly dense arrays of both p- and n-doped semiconductors can be fabricated. In addition, germanium and III-V and II-VI semiconductors (compound semiconductors) can be integrated in silicon substrates for CMOS applications using planar and vertical MOSFET architecture.

The present invention preferably may take advantage of VLS-growth or other related crystal growth mechanisms to embed nanowires. The term nanowire shall also include similar shaped structures with a preferential growth direction in pre-defined holes and the term hole shall also include templates in the semiconductor substrate of various geometries.

Such VLS growth is a catalytically driven process that yields one or more single-crystalline nanowires. The nanowires can be grown in templates with spacer walls. For example, the growth of <110> and <111> silicon nanowires can be performed in holes embedded in a <100> silicon wafer. The growth direction of the nanowires does not depend on the crystal orientation of the wafer substrate.

According to another aspect of the present invention, there is provided a hybrid semiconductor structure that includes a semiconductor substrate having a first crystallographic orientation, a single-crystalline nanowire in a hole of the substrate, the single-crystalline nanowire being separated from the substrate by a separation layer, the single-crystalline nanowire having a crystallographic orientation different of the substrate. Preferably such semiconductor structure is produced by one of the methods as set out above.

The separation layer separates the nanowire from the substrate at least during the fabrication process. As such, the separation layer preferably includes at least one of a dielectric layer and a metallic layer.

The nanowire preferably is made from a compound semiconductor of one of group III-V and II-VI materials. The catalyst preferably includes at least one metal selected from Au, In, Ga, Al, Cu, and Ni.

The nanowire can have a graded material composition along its length. Accordingly, the precursors used in the growth process have to be timely varied.

Any feature of one aspect of the invention may be applied to another aspect of the invention and vice versa.

Referring to the drawings, the details of preferred embodiments of the present invention are graphically and schematically illustrated. Like elements in the drawings are represented by like numbers, and any similar elements are represented by like numbers with a different lower case letter suffix.

FIGS. 1A to 1G illustrate the steps of the present method practiced in the case of nanowires (NWs) 50 having a <111> crystal orientation grown in holes 30 (template) of a silicon substrate 20. In the embodiment illustrated, the substrate 20 is a <100> oriented silicon wafer. Although FIGS. 1A to 1G illustrate the embodiment of NWs having a <111> orientation, the method can be utilized to grow NWs having a <110> orientation, for example.

As illustrated in FIGS. 1A and 1B, template holes 30 are formed in a <100> silicon wafer 20, e.g. by lithography and/or reactive ion etching. In the embodiment illustrated, a plurality of holes 30 are arrayed into the top surface 22 of a silicon wafer substrate 20. Additionally, a separation layer 38 is grown or deposited on the wall 32 and bottom 34 surfaces of the template holes 30. Then, as shown in FIG. 1C, a catalyst 40, e.g. gold, is deposited in the bottom surface 34 in each hole 30 in which growth of a NW is desired. As illustrated in FIGS. 1D and 1E, the prepared substrate 22 is subjected to a Vapor-Liquid-Solid (VLS) crystal growth process, as is known in the art. As shown in FIG. 1E, the layer 40 acts as catalyst for the VLS growth process. The VLS process may be practiced with or without dopants. Growth orientation of the crystal NW 50 (shown as <111> in the embodiment illustrated) is templated by the geometry of the hole 30, in particular, it is defined by the diameter (d), i.e. the diameter of the hole less twice the thickness of the separation layer 38 as shown in FIG. 1B. The separation layer 38 maybe thin enough such that the diameter of the hole maybe set equal to the diameter of the resulting nanowire. In the present example, the holes 30 have a circular cross-section and are of cylindrical form. The VLS growth process is continued until the catalyst droplet 40 is pushed upwards by growth of the NW 50 proximate the surface 22 of the silicon substrate 20 as shown in FIG. 1F. Growth of the NW 50 is then stopped, and the catalyst removed from the growth ends 52 of the NWs 50, as shown in FIG. 1G, and the substrate polished to the desired thickness. Alternatively to substrate 22, a silicon on insulator (SOI) 20b substrate can be used as starting substrate as shown in FIG. 1H.

The final hybrid semiconductor structure 60, also called a substrate wafer, in this embodiment has a composition of <111> oriented silicon NWs 50 embedded in a <100> silicon wafer 20 and separated by a separation layer 38, i.e. spacer material. Utilization of the VLS growth for manufacturing hybrid silicon substrates 60 allows direct integration of the nanocrystals in form of nanowires 50 at pre-defined locations within a silicon substrate 20.

The present method enables low temperature fabrication of additional NWs 50 in other holes subsequently disposed/arrayed in the surface 22 of the silicon substrate 20. Consequently, p- and n-type NWs as well as other types of semiconductors can be grown in the same silicon substrate 20. This is illustrated in FIGS. 2A to 2E. As illustrated in FIG. 2A, a first set of template holes 30 is arrayed in the surface 22 of the silicon substrate 20. The holes 30 are lithographically-defined and have a separation layer 38. As illustrated in FIG. 2B, p-type Si NWs are grown in the first set of template holes 30, according to the method set forth above in FIGS. 1A to 1H to produce a hybrid substrate wafer 60 having p-type NWs 50a.

A second set of template holes 30a is arrayed in the surface 22 of the silicon substrate 20 (see FIG. 2C). The second set of holes 30a illustrated also have a separation layer 38. As illustrated in FIG. 2D, n-type Si NWs 50b are grown in the second set of template holes 30a, according to the method set forth above in FIGS. 1A to 1H to produce a complex hybrid NW substrate wafer 62 having both p-type NWs 50a and n-type NWs 50b.

FIG. 2E illustrates that, instead of growing NWs 50 with different doping, the same process can be applied to grow, in the example illustrated, Ge NWs 52 and GaAs NWs 54 in the same substrate 20. Note that the holes 30 need not have a circular cross-section or a fixed, uniform diameter. The cross-section of the holes 30 can be rectangular, striped, or even arbitrarily shaped, to grow the NWs 50.

Figure 3:
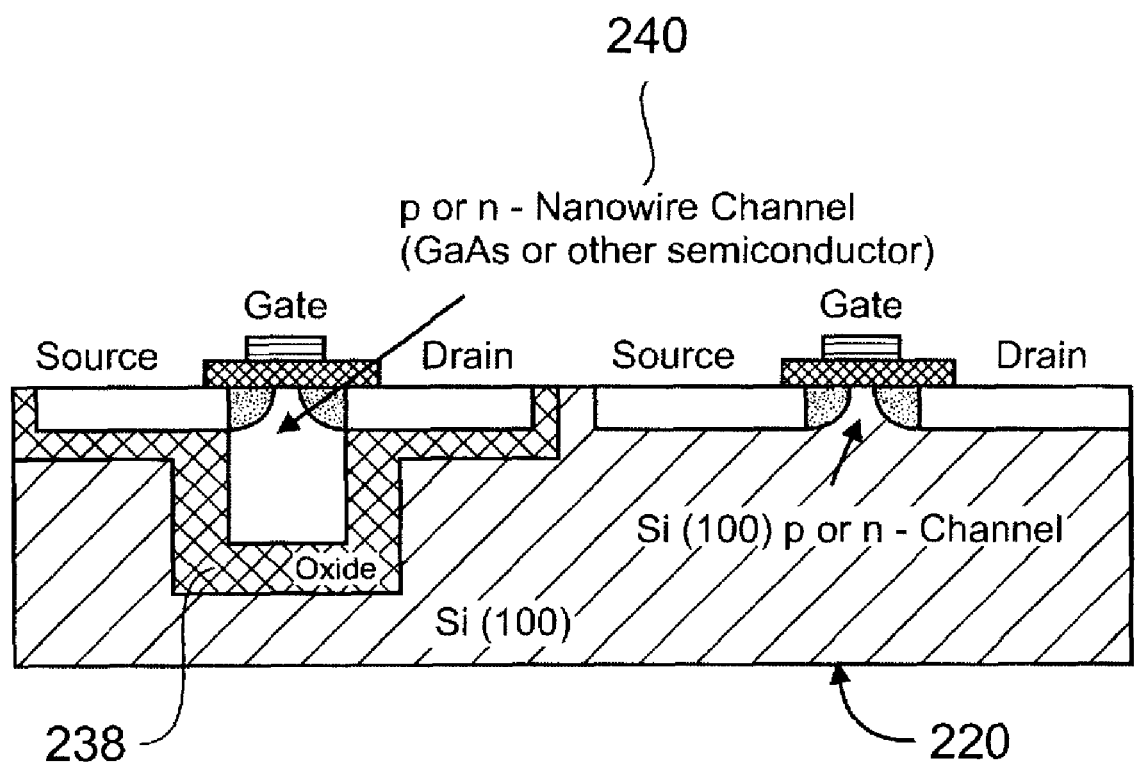
FIG. 3 is a schematic diagram illustrating the use of the planar architecture nanowires to fabricate complimentary FETs with gate channels.

Application of the present hybrid materials and methods for planar NW-MOSFETs 64 is shown in FIG. 3 on the left hand side. On the right hand side, a conventional architecture is illustrated. For the planar architecture, NWs 240 are used to fabricate complimentary FETs with gate channels having different crystal orientations, doping (type and/or concentrations) or different materials. The separation layer 238 can be used or can be part of the oxide layer.

Figure 4:
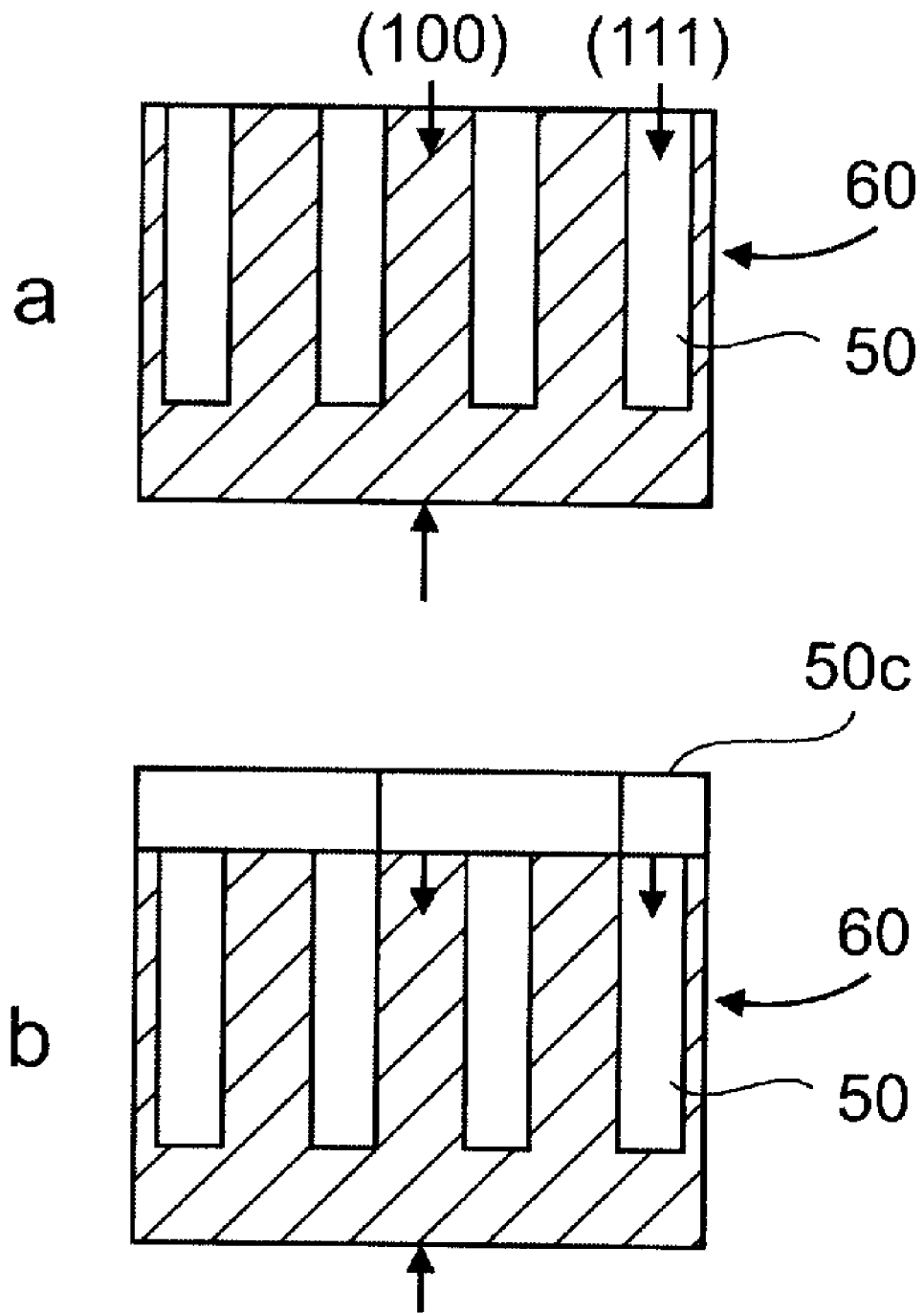
FIG. 4 is a schematic drawing illustrating selective epitaxial overgrowth of the embedded nanowires.

The hybrid semiconductor structure 60 according to FIG. 4a can be further processed by selective overgrowth 50c of the nanowires according to FIG. 4b to obtain large area substrates of compound semiconductors.

While the above description contains many specifics, these should not be construed as limitations on the scope of the invention, but rather as exemplifications of one or another preferred embodiment thereof.

We claim:

1. A method of providing a hybrid semiconductor structure including semiconducting components with semiconducting crystals of different crystallographic orientation, the method comprising the steps of:

providing a semiconductor substrate having a first crystallographic orientation;

causing a hole to be disposed in a surface of the semiconductor substrate, the hole having an interior wall and a bottom at a depth extending into the thickness of the substrate;

coating the hole with a separation layer;

depositing a growth catalyst at the bottom of the hole; and initiating a crystal growth process to grow a single-crystalline nanowire in the hole, to form the single-crystalline nanowire having a crystallographic orientation different from the substrate.

2. The method according to claim 1, further comprising the step of:

defining the crystallographic orientation of the single-crystalline nanowire grown in the hole by defining a cross-section of the hole.

3. The method according to claim 1, further comprising the steps of:

removing the catalyst from a growth end of the nanowire; and chemical-mechanical polishing the substrate.

4. The method according to claim 3, further comprising the step of:

adding an overgrowth layer to the semiconductor structure.

5. The method according to claim 1, wherein the crystal growth process is a Vapor Liquid Solid (VLS) growth process.

6. A method for providing a hybrid semiconductor structure including semiconducting components with semiconducting crystals of different crystallographic orientation, the method comprising the steps of:

providing a semiconductor substrate having a first crystallographic orientation;

causing a first set of holes to be disposed in a surface of the semiconductor substrate, each of the first set of holes having an interior wall and a bottom at a depth extending into the thickness of the substrate;

coating each of the first set of holes with a separation layer;

depositing a growth catalyst at the bottom of each of the first set of holes;

initiating a crystal growth process to grow a single-crystalline nanowire in each of the first set of holes, whereby the single-crystalline nanowire in the first set of holes has a crystallographic orientation different from the substrate;

causing a second set of holes to be disposed in the surface of the semiconductor substrate, each of the second set of holes having an interior wall and a bottom at a depth extending into the thickness of the substrate;

coating each of the second set of holes with a separation layer;

depositing a growth catalyst at the bottom of each of the second set of holes; and initiating a crystal growth process to grow a single-crystalline nanowire in each of the second set of holes, whereby the single-crystalline nanowire in the second set of holes has a crystallographic orientation different from the substrate and different from the single-crystalline nanowires in the first set of holes.

7. The method according to claim 6, further comprising the steps of:

defining the crystallographic orientation of the single-crystalline nanowires grown in the first set of holes by defining a cross-section of such holes; and defining the crystallographic orientation of the single-crystalline nanowires grown in the second set of holes by defining a cross-section of such holes wherein the cross-section of the second set of holes is different from the cross-section of the first set of holes.

* * * * *